(12) United States Patent
Kovanko et al.

(10) Patent No.: US 7,253,603 B2
(45) Date of Patent: Aug. 7, 2007

(54) CURRENT SENSOR ARRANGEMENT

(75) Inventors: Thomas E. Kovanko, Chicago, IL (US); Jeffrey A. Moore, Lake Zurich, IL (US); Debashis Satpathi, Sante Fe, NM (US)

(73) Assignee: S & C Electric Co., Chicago, IL (US)

( * ) Notice: Subject to any disclaimer, the term of this patent is extended or adjusted under 35 U.S.C. 154(b) by 12 days.

(21) Appl. No.: 11/304,754

(22) Filed: Dec. 16, 2005

(65) Prior Publication Data
US 2006/0232263 A1 Oct. 19, 2006

Related U.S. Application Data

(60) Provisional application No. 60/641,542, filed on Jan. 6, 2005.

(51) Int. Cl.
*G01R 15/18* (2006.01)
(52) U.S. Cl. .................................. 324/127; 324/117 R
(58) Field of Classification Search ................. None
See application file for complete search history.

(56) References Cited

U.S. PATENT DOCUMENTS 3,434,052 A * 3/1969 Fechant ..................... 324/127
4,348,638 A * 9/1982 Boldridge, Jr. ............. 324/127
6,414,474 B1 * 7/2002 Gohara et al. .......... 324/117 H
6,614,218 B1 * 9/2003 Ray ....................... 324/117 R
6,624,624 B1 * 9/2003 Karrer et al. ........... 324/117 R
2004/0027748 A1 * 2/2004 Kojovic et al. ............... 361/62
2004/0201373 A1 * 10/2004 Kato ..................... 324/117 R
2005/0248430 A1 * 11/2005 Dupraz et al. .............. 336/200
2006/0082356 A1 * 4/2006 Zhang et al. ........... 324/117 R

* cited by examiner

*Primary Examiner*—Paresh Patel
(74) *Attorney, Agent, or Firm*—James V. Lapacek

(57) ABSTRACT

A current sensor is provided including a Rogowski coil in an assembly that is easily positioned about a conductor, e.g. without cutting the line or deenergizing the line. In one arrangement, the Rogowski coil is formed about a split helical structure such that the ends of the Rogowski coil are not coincident. While this does introduce a small error in the current measurement, this small error is easily correctable by calibration and/or application software. The current sensor includes suitable insulation such that it can be placed about energized, high-voltage lines.

6 Claims, 4 Drawing Sheets

CURRENT SENSOR ARRANGEMENT

This application claims the benefit of U.S. Provisional Application No. 60/641,542 filed on Jan. 6, 2005.

BACKGROUND OF THE INVENTION

1. Field of the Invention

The present invention relates generally to current sensors and more particularly to a Rogowski coil provided in an assembly that is easily positioned about a conductor.

2. Description of Related Art

Various current sensors have been proposed for sensing the current flowing through a conductor. For example the voltage induced in a Rogowski coil about a conductor is processed by an integrator to provide a sensed current. The Rogowski coil is an "air-cored" toroidal coil formed by winding turns around a core or support structure of non-magnetic material, e.g. diamagnetic or paramagnetic material of relative permeability of 1. The conductor to be measured in then placed through the coil structure. In some arrangements, the Rogowski coil is formed as a split coil with some effect on the amplitude of the output signal.

While the arrangements of the prior art may be generally useful, it would be desirable to provide a current sensor that is easy to position about a conductor.

SUMMARY OF THE INVENTION

Accordingly, it is a principal object of the present invention to provide a current sensor including a Rogowski coil provided in an assembly that is easily positioned about a conductor, e.g. without cutting the line or deenergizing the line.

It is another object of the present invention to provide a current sensor including a Rogowski coil formed about a split helical structure such that the ends of the Rogowski coil are not coincident.

These and other objects of the present invention are efficiently achieved by a current sensor including a Rogowski coil provided in an assembly that is easily positioned about a conductor, e.g. without cutting the line or deenergizing the line. In one arrangement, the Rogowski coil is formed about a split helical structure such that the ends of the Rogowski coil are not coincident. While this does introduce a small error in the current measurement, this small error is easily correctable by calibration and/or application software. The current sensor includes suitable insulation such that it can be placed about energized, high-voltage lines.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
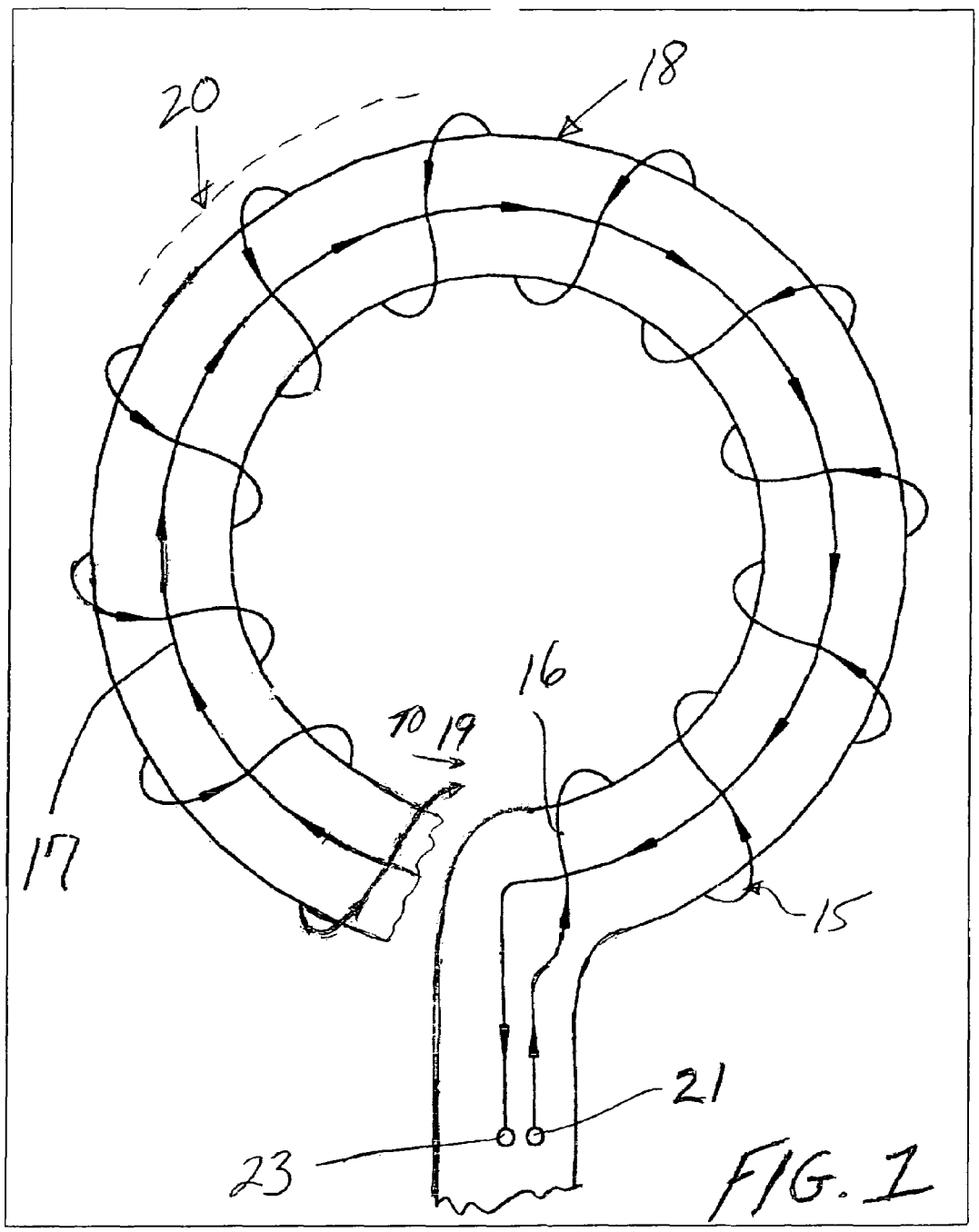
FIG. 1 is a diagrammatic view of the construction of the current sensor of the present invention.
Figure 2:
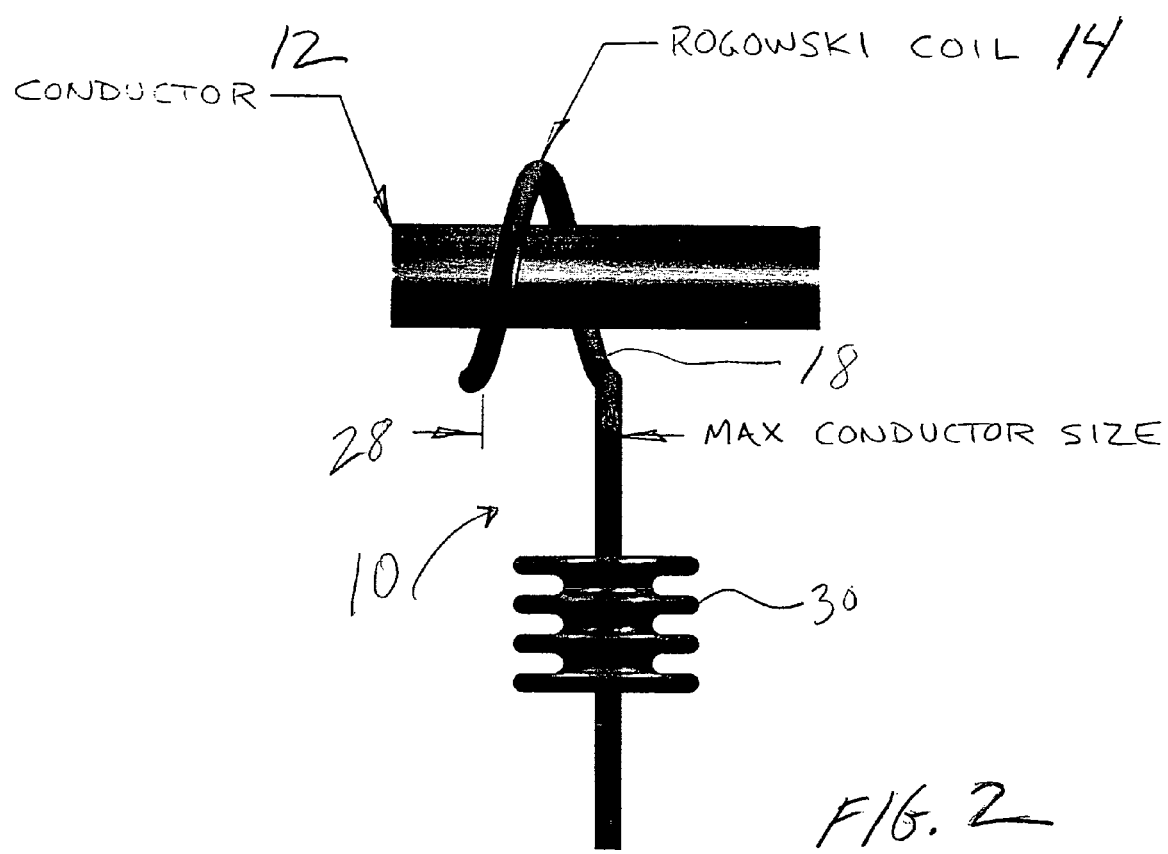
FIG. 2 is a front elevational view of the current sensor of FIG. 1 illustrating an operative position about a conductor.
Figure 4:
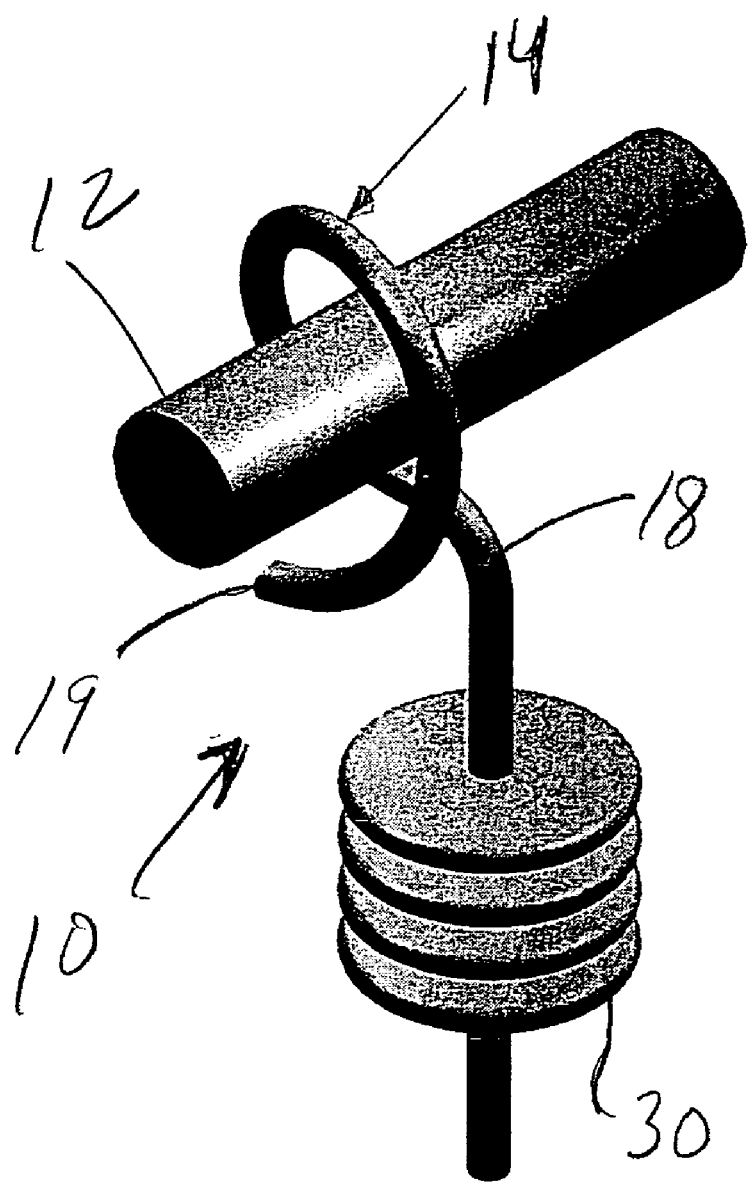
FIG. 4 is a perspective view of the current sensor rotated by ninety degrees from the position in FIG. 2 to an operative position about the conductor.

Referring now to FIGS. 1 and 2, the current sensor 10 of the present invention is useful to sense the current in a conductor 12 about which the current sensor 10 is positioned as shown in FIG. 2. As shown in FIG. 1, the current sensor 10 includes a Rogowski coil 14 (i.e. "air-cored" toroid) that is formed by winding turns 15 of wire 16 about and along a core 18, e.g. a rod. The core 18 is non-magnetic material, e.g. a diamagnetic or paramagnetic material of relative permeability of approximately 1 in a specific implementation. In the preferred embodiment, the core 18 is formed in a split helical configuration so as to define at least one complete turn and such that ends of Rogowski coil 14 are not coincident. While this does introduce a small error in the current measurement, this small error is easily correctable by calibration and/or application software. As shown in FIG. 1, in a specific embodiment, the Rogowski coil 14 includes a compensation turn 17 traversing around the middle of the core 18, i.e. the compensation turn 18 being formed via reversing the direction of the wire 16 after turns 15 are formed up to the end 19 (FIG. 4) of the core 18 and returning the wire back around the core 18 and back to the beginning of the Rogowski coil 14, the wire 16 at the beginning of the winding at 21 forming one side of the output of the Rogowski coil 14 and the return end of the compensation turn 17 at 23 forming the other side of the output. One side of this output across 21, 23 is grounded. Although not required, the compensation turn 17 provides improved performance as is known to those skilled in the art.

The core 18 may be worked into the desired shape or flexible material may be utilized. Thus, the Rogowski coil 14 provides accurate measurements since it is wound about the elongated member 18 over one complete turn so as to completely encircle the conductor 12. Further, the rigid structure of the current sensor 10 permits increased accuracy of the Rogowski coil 14 and ease of manufacture. In a specific arrangement, a coating is applied at 20 over the wire 16 forming the Rogowski coil 14, e.g. in a specific embodiment, the coating is such as to provide suitable insulation for use about energized high-voltage lines. In another embodiment, the Rogowski coil 14 is formed as a rigid, self supporting structure whereby the member 18 is not required.

The pitch of the helix of the Rogowski coil 14 is defined to provide for the maximum diameter of the conductor 12 to be sensed. For example, as seen in FIG. 2, the dimension 28 determines the maximum conductor diameter that can be accommodated, i.e. permitting placement of the current sensor 10 in operative position as shown in FIG. 2 as will be explained in more detail hereinafter. However, if the core 18 is fabricated from flexible material, the current sensor 10 could accommodate larger conductors.

Figure 3:
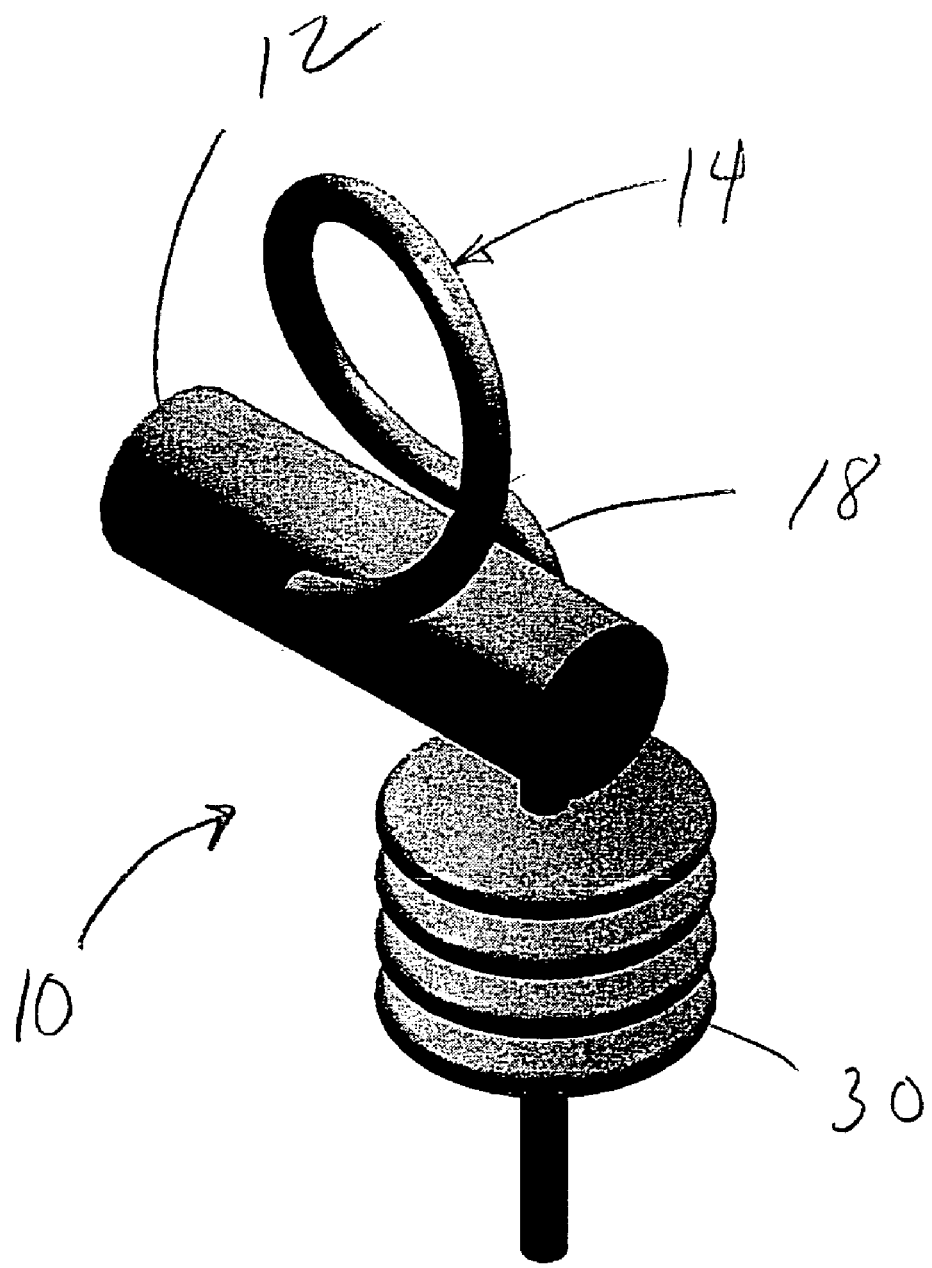
FIG. 3 is a perspective view of the current sensor of FIGS. 1 and 2 in an orientation for positioning about a conductor.

In use, and referring now additionally to FIG. 3, the current sensor 10 is positioned around the conductor 12 by first sliding the Rogowski coil 14 to over the conductor 12 so as to allow the conductor 12 to pass thru the gap at 28 of FIG. 2. Next, the current sensor 10 is rotated 90 degrees to the position of FIG. 4 such that the conductor 12 is now within the Rogowski coil 14 achieving the operative, sensing position. Removal of the current sensor 10 from the conductor 12 is achieved by reversal of this process, namely, by rotating the current sensor 10 from the position of FIG. 4 to the position of FIG. 3.

According to the present invention, the current sensor 10 may be installed as a fixed sensor or utilized as part of a portable sensor arrangement. Of course, it should also be understood that the current sensor 10 may be utilized as a retrofit arrangement to existing conductors and post-mounted applications in the field. In accordance with one specific embodiment, an insulator 30 is provided integral with the sensor 10 provided for use of the current sensor outdoors and with medium and high-voltage lines.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

The invention claimed is:

1. A Rogowski coil for a current sensor arrangement comprising a split helical structure that defines a complete turn and a coil winding distributed over the split helical structure so as to encircle a conductor and such that the ends of the Rogowski coil are not coincident whereby the Rogowski coil may be positioned about a conductor.

2. The Rogowski coil of claim 1 wherein the conductor size to be encircled by the current sensor is defined by the pitch of the split helical structure.

3. The Rogowski coil of claim 1 wherein the split helical structure is formed from an elongated rod.

4. The Rogowski coil of claim 3 further comprising a protective coating provided over the coil winding.

5. The Rogowski coil of claim 1 wherein the coil winding includes a compensation turn.

6. The Rogowski coil of claim 1 wherein the split helical structure is flexible.

\* \* \* \* \*